(12) United States Patent
Manfredi et al.

(10) Patent No.: US 6,647,579 B2
(45) Date of Patent: Nov. 18, 2003

(54) BRUSH PRESSURE CONTROL SYSTEM FOR CHEMICAL AND MECHANICAL TREATMENT OF SEMICONDUCTOR SURFACES

(75) Inventors: Paul A. Manfredi, Waterbury Center, VT (US); Douglas P. Nadeau, Underhill, VT (US)

(73) Assignee: International Business Machines Corp., Armonk, NY (US)

( * ) Notice: Subject to any disclaimer, the term of this patent is extended or adjusted under 35 U.S.C. 154(b) by 387 days.

(21) Appl. No.: 09/739,152

(22) Filed: Dec. 18, 2000

(65) Prior Publication Data

US 2002/0073495 A1 Jun. 20, 2002

(51) Int. Cl.[7] .......................... A47L 25/00; A47L 15/00; G03D 5/06
(52) U.S. Cl. .............................. 15/77; 15/88.2; 15/102; 134/902
(58) Field of Search ........................... 15/77, 102, 88.2, 15/88.3; 134/6, 33, 902; 451/56, 442, 443, 444, 397, 398

(56) References Cited

U.S. PATENT DOCUMENTS

| | | | | |
|---|---|---|---|---|
| 5,486,129 A | | 1/1996 | Sandhu et al. | 451/5 |
| 5,829,087 A | * | 11/1998 | Nishimura et al. | 15/88.2 |
| 5,943,726 A | * | 8/1999 | Eitoku et al. | 15/77 |
| 5,947,134 A | | 9/1999 | Kim et al. | 134/57 R |
| 6,027,398 A | | 2/2000 | Numoto et al. | 451/285 |
| 6,178,580 B1 | * | 1/2001 | Ishihara et al. | 15/77 |

* cited by examiner

*Primary Examiner*—Terrence R. Till
*Assistant Examiner*—Laura C Cole
(74) *Attorney, Agent, or Firm*—Francis J. Thornton; Robert A. Walsh

(57) ABSTRACT

A semiconductor wafer chemical mechanical treatment apparatus having a sectional extended arm carrying a head. The sectional arm is comprised of a fixed yoke and an elongated arm positioned in said yoke on a pivot. The elongated arm carries a first means thereon for establishing and maintaining a given loading or pressure on the head. A second means, is positioned on the yoke, adjacent to the elongated arm for temporarily altering the given loading or pressure on the head established by the first means without disturbing the setting of the first means such that when the second means is reset the given head load or pressure established by said first means is automatically restored.

5 Claims, 3 Drawing Sheets

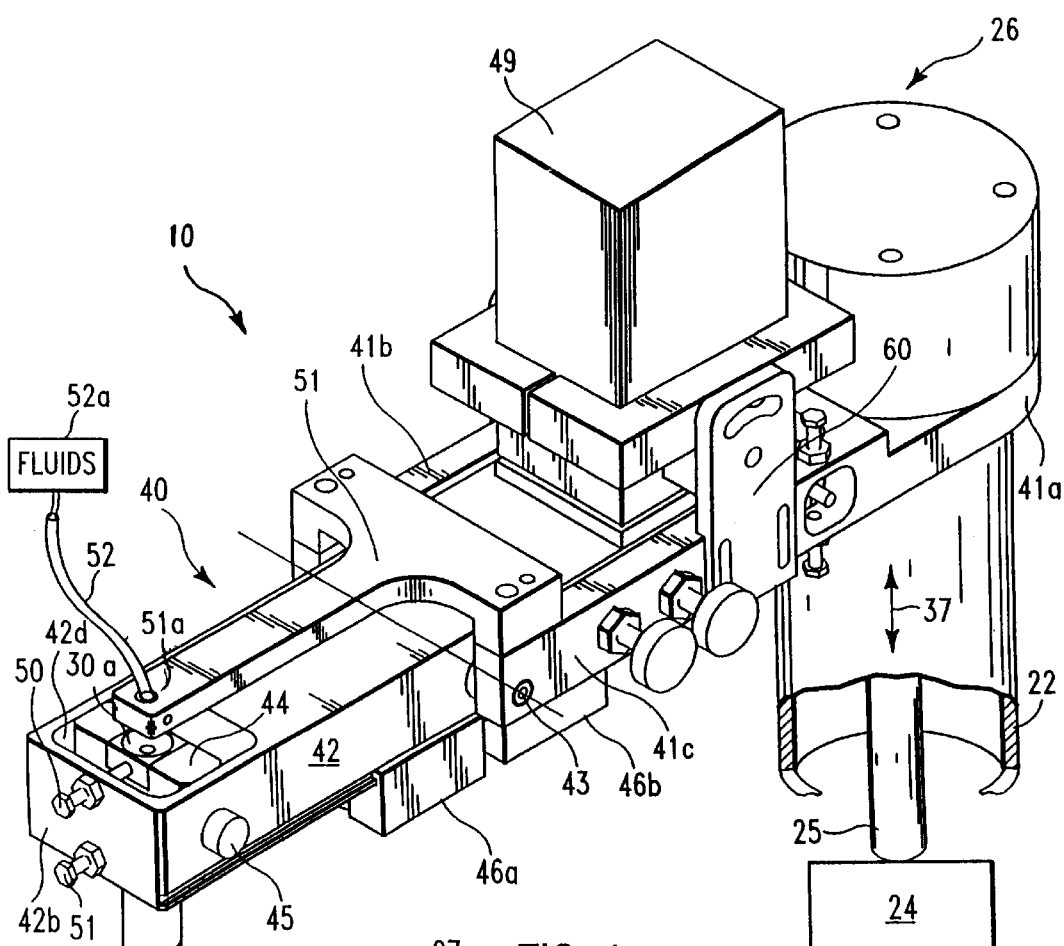
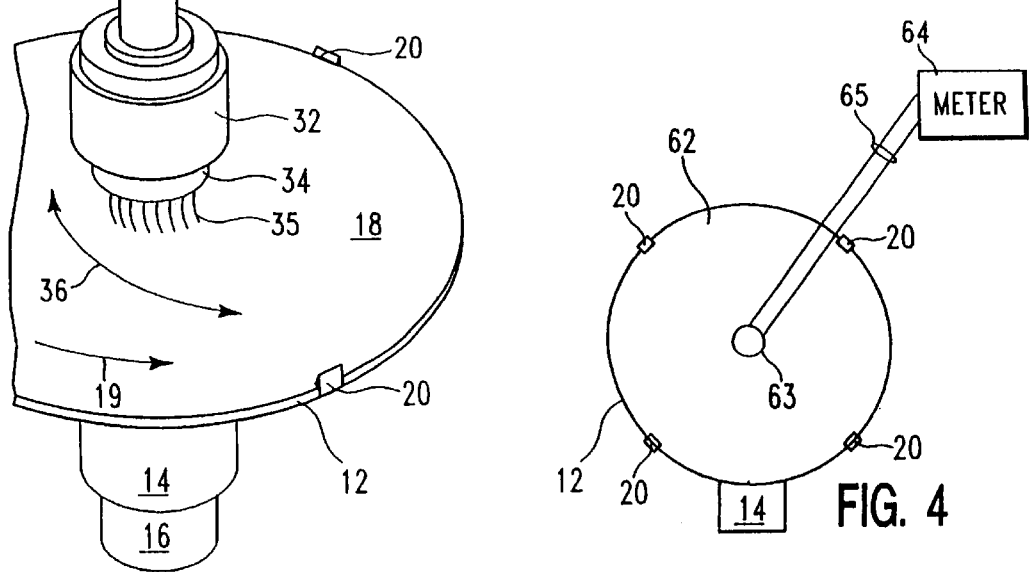
FIG. 1
FIG. 4

BRUSH PRESSURE CONTROL SYSTEM FOR CHEMICAL AND MECHANICAL TREATMENT OF SEMICONDUCTOR SURFACES

FIELD OF THE INVENTION

The present invention relates generally to an apparatus used to treat semiconductor wafer surfaces. More particularly, the present invention is an apparatus, for treating spinning semiconductor wafer surfaces, in which there is provided a head, for contacting the surface of the wafer, having attached thereto a first means for setting the head against the wafer surface with a selected predetermined force and a second means for temporarily and selectively altering the selected predetermined force set by the first means without altering the setting established by said first means.

BACKGROUND OF THE INVENTION

Production of semiconductor devices requires the treatment of a semiconductor wafer with a number of chemical, mechanical or chemical-mechanical processing steps.

During these processing steps, even minute changes or variations in the wafer surface can produce effects that can adversely affect later processing steps and thus affect the reliability of the devices formed in the wafer. For example, such changes and variations can fail to remove contaminants or otherwise fail to appropriately condition the surface of the semiconductor wafer such that later processing steps are interfered with. When such processing steps fail they usually result in either instant or premature failure or long term degradation and shortened life of some or all or the devices produced in the wafer.

Certain of these processing steps require the use of an apparatus that can place a head, carrying a pad or brush, steeped in a suitable chemical such as a cleansing agent, adjacent to or against the surface of the wafer to treat, e.g., clean, or otherwise condition, the surface of the wafer.

In all such presently available apparatuses the force between the brush or pad carrying head and the surface, i.e., the head pressure, is substantially unknown and uncontrolled. Further the prior art apparatuses lack any means for consistently setting, maintaining or monitoring the head pressure. This lack of control of the head pressure is inherent in the prior art apparatuses because their rigid design renders them incapable of either achieving or consistently maintaining a known head pressure.

The present inventors have now found that many of such wafer processing steps require, for optimum results, that distinct head pressures be maintained and that for most process steps that the head pressure be, at least, a selected minimum pressure. The present inventors have also found that by doing so more consistent production results can be obtained.

The present inventors have also found that while many steps require this minimum head pressure other steps require that the head pressure be altered from this minimum pressure.

Therefore, it is most desirable that such semiconductor devices be fabricated using an apparatus that is capable of producing and maintaining different selected head pressures as required by the process steps.

It is also desirable, for many process steps, that the apparatus be readily and quickly capable of returning the applied head pressure to a preselected minimum head pressure.

SUMMERY OF THE PRESENT INVENTION

The present invention provides a head processing apparatus having a first means that can be set to establish and provide a selected head loading or pressure, i.e., the loading or pressure between a brush or pad carrying head and a wafer surface, and a second means that can be activated to temporarily alter or adjust the selected head pressure without affecting the setting of the said first means that establishes the selected head pressure such that when said second means is deactivated, the apparatus will instantly return to the selected head pressure established by said first means.

The present invention by providing said first and second head loading means maintains better processing conditions thus causing all the processing steps performed by the apparatus to be performed under optimum and repeatable conditions.

In this way, the present invention, achieves better more consistent results and a lower defect or scrap rate.

More particularly, the present invention accomplishes these desirable results in a semiconductor wafer chemical mechanical treatment apparatus having a sectional extended arm carrying a head. The sectional arm is comprised of a fixed yoke and an elongated arm positioned in said yoke on a pivot. The elongated arm carries a first means thereon for establishing and maintaining a given loading or pressure on the head. A second means, is positioned on the yoke, adjacent to the elongated arm for temporarily altering the given loading or pressure on the head established by the first means without disturbing the setting of the first means such that when the second means is reset the given head load or pressure established by said first means is automatically restored.

Therefore it is an object of the present invention to provide a new wafer treatment apparatus which is provided with first means that can be set to create a selected head pressure between a brush and pad carrying head and a wafer surface and with second means for altering the selected head pressure as required by the process without altering the setting of the first means.

These objects, features and advantages of the present invention will be become further apparent to those skilled in the art from the following detailed description taken in conjunction with the accompanying drawings wherein:

BRIEF DESCRIPTION OF THE DRAWINGS

FIG. 1 is an isometric top view of the wafer processing apparatus of the present invention.

FIG. 4 shows the wafer holding chuck of FIG. 1 having a special load cell plate thereon.

DESCRIPTION OF THE PREFERRED EMBODIMENT

Figure 2:
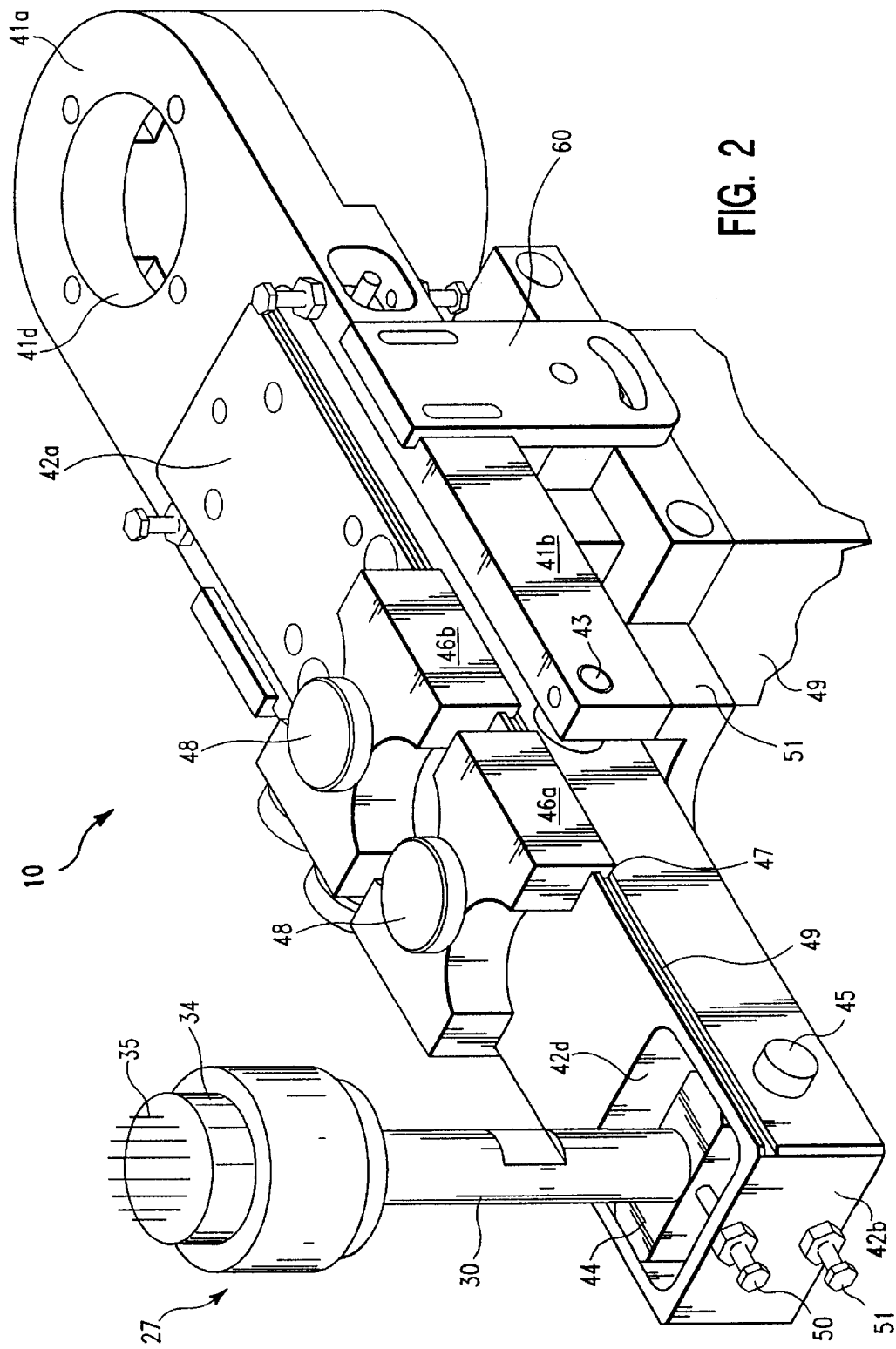
FIG. 2 is an isometric view of the bottom of the head assembly of the wafer processing apparatus of the present invention as shown in FIG. 1.
Figure 3:
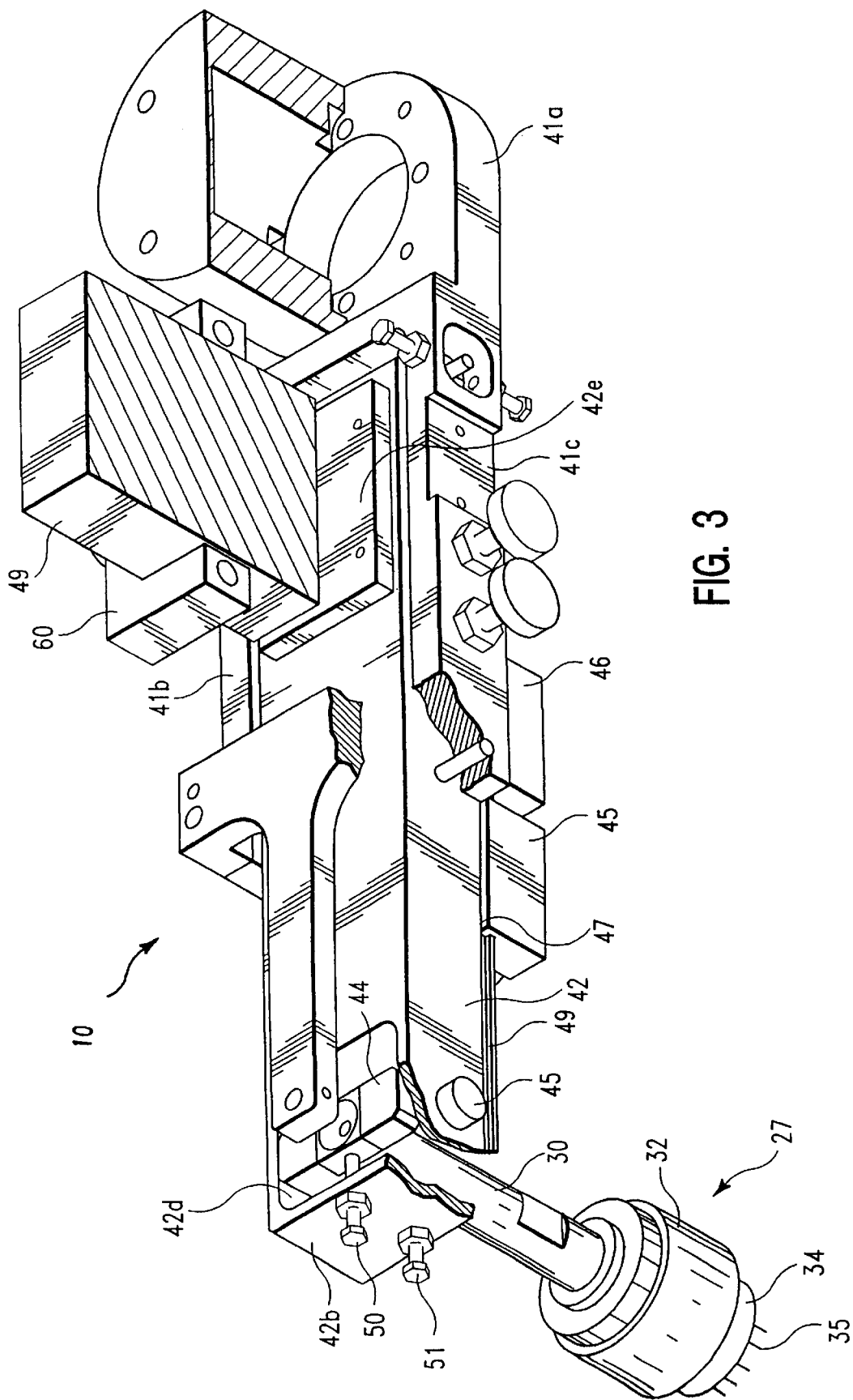
FIG. 3 is a partial sectional view of the head assembly of FIG. 1.

With reference now to FIGS. 1, 2 and 3 a wafer processing apparatus 10 employing the present invention will be described.

The apparatus 10 includes a rotary chuck 12 supported by the shaft 14 of motor 16 as is well known to the art. A semiconductor wafer 18 is supported on chuck 12 and maintained centrally thereon by a plurality of clips or edge supports 20. The wafer chuck is mounted on the motor 16 so that the wafer 18 can be spun around its axis as shown by arrow 19.

Adjacent the chuck 12 there is positioned a hollow vertical post 22 coupled to a reciprocating motor 24 via a shaft 25 which extends from the motor 24, up through the post 22, to connect to one end of a cantilevered assembly 26 supported on the post 22. The other end of the cantilevered assembly 26 is provided with a brush head assembly 27 formed of a descending rod 30 having a passage extending along its vertical axis. The rod 30 carries, at its lower end, a head 32 provided with means 34 for mounting either a brush or pad 35 thereon.

The motor 24 is designed to move the assembly 26 in a reciprocating arcuate path across the surface of the wafer 18, as shown by the double headed arrow 36, and to step the assembly 26 up and down, as shown by the double headed arrow 37 so that the brush 35 can be positioned with respect to the wafer surface as required by the process.

When the wafer is being spun by the motor 16 turning the chuck 12, the brush 35, is stepped, by the motor 24, into position so as to touch the wafer surface and then moved, by the same motor 24, back and forth in a series of reciprocating arcuate paths across the spinning wafer surface. Because the wafer is spinning and the brush or pad is being moved across the surface of the wafer, the entire surface of the wafer will pass under the head and is thus treated as required by the process.

In the prior art, the assembly 26 was rigid, and therefore the amount of pressure applied by the brush 35 to the wafer surface was solely based on position of the brush 35 with respect to the wafer surface as determined by the stepping motor 24. As is well known to the art, the stepping motor 24 moves the head assembly toward the surface of the wafer in fixed incremental steps. To assure that the head did not crush the wafer surface the prior art limited the position of the head to a preset position above where the surface the wafer was expected to be.

Because the stepping motor moves only with incremental steps, these limits would in some instances cause the motor to stop the head so that the brush 35 was above and not touching the wafer surface, in other cases the limits would cause the brush 35 to barely touch the wafer surface and in still other case the brush 35 would be stopped in full contact with the surface but without knowing if what pressure, if any, was being applied to the wafer surface. Thus, in the first above described case, little or no pressure would exist between the brush 35 and the wafer surface and, in the other cases, the pressure applied would be unknown. Further, in those cases where the head did contact the wafer surface if the surface was warped or undulating the applied head pressure would vary as the head passed over the warped or undulating surface.

If the treatment being performed required a minimum amount of pressure greater than that actually being applied, the treatment could either take substantially longer than expected or could even be ineffective. On the other hand if head was positioned such that too much pressure was applied to the wafer surface the wafer surface could be damaged.

Because of this uncontrolled reliance on the positioning of the head by the stepping motor the pressure applied between the head and the wafer surface was effectively uncontrollable.

Later techniques attempted to more accurately position the bead with respect to the wafer surface by using proximity senors such as laser beams but again, because of the limiting incremental steps imposed by the stepping motor, the pressure applied by the head arm remained unknown and indeterminable.

The present invention avoids these problems of the prior art by designing the assembly 26 as a yoke supported pivoting arm carrying a pivoting head assembly and a primary means for providing the brush 35 with a selected brush to wafer pressure or loading whenever the brush is placed in contact with a wafer surface. Once this primary mean has established the selected brush to wafer pressure, then whenever the stepping motor places the brush 35 anywhere within a specified distance from the wafer surface that the brush 35 will bear on the wafer surface with the known preestablished loading or pressure.

Still further the present invention provides secondary means which when activated, can selectively alter the loading or pressure between the brush and the wafer surface established by the primary means without disturbing the setting of the primary means that established the preload. This means that the brush to wafer loading or pressure can be altered on the fly at any time during the process and also means that when the secondary means is deactivated that the pre-loaded brush head to wafer pressure established by the primary means will automatically be restored.

The head assembly 26, of the present invention, achieves these desirable results by use of a cantilevered, sectional assembly 40 maintained at a right angle to the post 22 and extending horizontally therefrom. This sectional assembly 40 comprises a yoke 41, having a body portion 41a and bifurcated arms 41b and 41c, and a pivoting, extended, brush head carrying, elongated bar arm 42. Preferably both the yoke 41 and the arm 42 are made of stainless steel. This bar arm 42 is positioned between and supported in the yoke arms 41b and 41c by a pivot pin 43 passing through the center of the bar arm 42 and the end of the yoke arms, 41b and 41c. Thus the bar arm 42 has a proximal end 42a generally positioned between the bifurcated arms 41b and 41c and a distal end extending past the ends of the bifurcated arms 41b and 41c. It is of course understood that the pivot pin 43 is made such that the bar arm 42 can rotate within the yoke arms 41b and 41c. The yoke body 41a is also provided with an opening 41d therein so that the yoke may be secured to the shaft 25 of the motor 24 passing up through the hollow center of the post 22.

As shown in the FIGS. 1, 2, 3, and 4, the bar arm 42 has its proximal end 42a enclosed between the bifurcated arms 41b and 41c and its distal end 42b extending, i.e.; cantilevered, past the ends of the bifurcated arms 41b and 41c. The distal end 42b of the bar arm 42 is provided with an opening 42d in which there is positioned a descending shaft 30 having the head 32 thereon. The top of the descending shaft 30 is connected to a cross bar 44 located in the opening 42d. This crossbar is supported in the opening 42d by locating it between a pair of shoulder screws 45. These shoulder screws 45 are designed to permit the shaft 30 to swing or pivot in the opening 42d.

As especially shown in FIG. 2, the bar 42 has a first means for applying a selected force on the brush head 32 when the brush head is brought close to a wafer positioned on the chuck 12. These first means comprise the one or more sliding weights such as weights 46a and 46b hung on the bottom of the bar 42. Each of these weights 46a and 46b is provided with a pair of inwardly projecting ears 47 that hang in longitudinal grooves 49 positioned along the lower edge of the bar 42. The weights 46a and 46b are further provided with screws 48a and 48b passing there through so that the weights may be locked in position anywhere along the bar 42 as will be further explained below.

The proximal end 42a of the bar arm 42 is positioned between the bifurcated arms 41b and 41c such that is beneath and spaced from a second means, such as an electromagnet 49, for selectively altering the amount of head pressure applied by the weighs 46a and 46b. The electromagnet 49 is supported a fixed height above the proximal end 30a of the bar arm 30 by hangers 60, which are secured atop the yoke arms 41b and 41c. Because stainless steel is nonmagnetic, it is necessary that an iron plate 42e be secured to the proximal end 42a of the bar 42. With this plate 42e is in position and the electromagnet is activated the plate will be pulled up causing the distal end 42b of the bar 42 to press harder against the surface of the wafer 18. If, instead of being made out of iron, the plate 42e is formed of magnetic material then the electromagnet can, by selecting the direction of current flow there though, be used to either attract or repel the proximal end of arm 42 and thereby increase or decrease the pressure applied by the head 32 on the wafer surface. The length of the entire head assembly 26, i.e., the yoke 41 and the arm 42, is, as shown in the FIG. 1, sufficient to position the head 32 over the center of the rotary chuck 12.

Positioned on the distal end of the arm 42 is a "T" shaped drip arm 51 having an extended leg end 51a cantilevered over the brush head. This cantilevered end 51a supports a hose 52 coupled to a suitable source 52a of the fluids required in the wafer treatment process as is well known to the art. The cross bar Sib of the T shaped drip arm 51 spans across and is fixed between the bifurcated arms 41b and 41c of the yoke 41. The extended leg of the "T" is of a length as to position the hose 52 over the port 30a passing along the axis of the shaft 30 such that the fluids passing through the hose 52 will be delivered through the brush 35 onto the surface of the wafer being treated, as will be discussed further below.

The operation of the equipment will now be described. In present day wafer treatment processes, ideal brush to wafer pressures for various steps have been established either empirically or by calculation. When the apparatus of the invention is to be used for a selected process, the brush head locking screws 50 and 51 are loosened to allow the head 32 to swing in the pivot screws 45. The wafer chuck 14 has a special load cell plate 62 placed thereon. This plate 62 is designed to have, in its center, a load cell 63 electrically coupled to a detection meter 64 by wires 65. The plate 62 is designed to carry the load cell 63 such that the upper surface of the load cell 63 is positioned at same height as the surface of a wafer 18 placed on the chuck 12. The head 32 is then moved vertically so that it is placed in contact with the surface of the pressure detector or load cell 63. Once the head 32 is in the desired position the weights 46a and 46b are moved along the arm 42 to pivot the bar 42 and establish a selected head to surface pressure.

For example, it has been found that, for effective cleaning of a wafer surface, a head to surface pressure of 0.75 ounces/inch$^2$ is especially beneficial. It is, of course, understood that for other processes a greater or lessor pressure may be required.

One acceptable pressure sensor that has been used for measuring the head to wafer surface pressure is a 0 to 5 pound/inch$^2$ load cell, model LCGC-5, sold by Omega Engineering Inc. of Stamford, Conn. This load cell is used in conjunction with a model DP25S load cell meter also sold by Omega Engineering Inc.

Although, for purposes of illustration and ease of description, the pressure sensor 63 is, as shown in FIG. 1, positioned adjacent the chuck 12, in production conditions, it is preferred to use a special pressure sensor holder that can be substituted for the wafer 18 on the chuck 12.

Once the desired head to wafer surface pressure has been established, by moving the weights 46a and 46b, the weights are locked in position, the head raised off the surface of the pressure sensor. If the sensor is on the chuck 12 then the entire pressure sensor holder is removed off the chuck 12 and replaced thereon by the wafer that is to be treated.

Because the pressure sensor, whether used in the pressure sensor holder positioned on the chuck 12 or positioned adjacent the chuck 12, has its upper surface in the same plane as the surface of a wafer 18 held in chuck 12 the brush will be, when the assembly 26 is again positioned over a wafer in the chuck as it was positioned over the pressure sensor, in contact with the wafer surface with the same force as it contacted the pressure detector 63.

Thus once a wafer 18, to be treated, is placed on the chuck 12, the chuck is set spinning, the assembly 26 is swung over the spinning wafer and the desired fluid is passed through the hose as the brush is lowered against the wafer surface. Because this lowering of the brush is accomplished by the same stepping motor used to set the brush in position over the pressure sensor surface, the brush 35 will be positioned at the same distance from the wafer surface as it was positioned from the surface of the pressure head. Thus the brush will bear on the wafer surface with the same pressure that it bore against the pressure head, i.e., the pressure established by positioning the sliding weighs 45 and 46 on the arm 42. In this way a known brush to wafer pressure can be established and maintained during the process steps.

Once the brush arm 35 is in contact with the rotating surface of the wafer 18, the brush is moved, in the above described arcuate path, so that it will treat the entire wafer surface at the preestablished pressure.

If we now assume that the next process step requires an increase in the pressure applied between the brush and the wafer surface, such an increase can easily be achieved by activating the electromagnet so as to attract the iron plate 42e. By attracting the plate 42e the proximal end of the arm 42 is raised and the distal end is pivoted down placing the brush against the wafer surface with greater force.

If it is found desirable to either increase or decrease the pressure applied between the brush and the wafer surface the iron plate 42e should be replaced by a fixed magnet. By so substituting a fixed magnet for the iron plate and by changing the direction and amount of current through the electromagnet 49 the applied head to surface pressure can be either increased or decreased. As is well known, when a current is passed through an electromagnet it creates magnetic forces that will either attract to or repel another adjacent magnet. In this way the fixed magnet, substituted for iron plate 42e can be either pulled up toward the electromagnet 49 or repelled therefrom. These forces either pull or push the proximal end 42a of arm 42, positioned beneath the electromagnet, thus pivoting the distal end 42b in the opposite direction. By so pivoting the bar 42 around the pin 43, the brush will be either pushed harder against the wafer thus increasing the brush to wafer surface pressure or be pulled away from the wafer surface thus reducing the brush to wafer pressure.

In this way the electromagnet 49 in conjunction with a magnetic plate can be used to alter the pressure between the brush head and the wafer surface established by the weights 46a and 46b.

Once this altered pressure is no longer required, the current, applied to the electromagnet is cut off and causing the preestablished pressure created by the weights to be automatically restored.

This completes the description of the preferred embodiment of the invention. Since changes may be made in the above construction without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. A semiconductor wafer chemical mechanical processing apparatus comprising:

a chuck for holding a semiconductor wafer having a surface to be treated in a in a known position;

a head assembly carrying a brush;

a motorized mechanism positioning said brush adjacent said wafer surface;

a first pressure adjusting device on said head assembly which establishes a first selected pressure between said brush and said wafer surface, and a second pressure adjusting device on said head assembly which can temporarily alter the first selected pressure established between said brush and said wafer surface by said first pressure adjusting device without changing the setting of the said first pressure adjusting device that established the selected first pressure, said second pressure adjusting device being independent of said first pressure adjusting device such that when said second pressure adjusting device is deactivated, the first selected pressure established by said first pressure adjusting device is re-established between said brush and said wafer surface;

said head assembly comprising:

an extended arm mounted on a post, said extended arm comprising a yoke having bifurcated arms and an elongated bar suspended between said bifurcated arms on a pivot;

said elongated bar having a proximal end positioned between said bifurcated arms and a distal end extending beyond said bifurcated arms, wherein said head assembly comprises:

an extended arm mounted on a post, said extended arm comprising a yoke having bifurcated arms and an elongated bar suspended between said bifurcated arms on a pivot;

said elongated bar having a proximal end positioned between said bifurcated arms and a distal end extending beyond said bifurcated arms.

2. The apparatus of claim 1 wherein:

said first pressure adjusting devices comprises a weight suspended on said elongated bar, said weight being positional along the length of said elongated bar; and said second pressure adjusting device comprises an iron plate positioned on the proximal end of said elongated bar and an electromagnet suspended on said bifurcated arms above said iron plate.

3. The apparatus of claim 1 wherein:

said first pressure adjusting device comprises a weight suspended on said elongated bar, said weight being positional along the length of said elongated bar; and said second pressure adjusting device comprises a fixed magnet positioned on the proximal end of said elongated bar and an electromagnet suspended on said bifurcated arms above said fixed magnet.

4. The apparatus of claim 1 wherein:

a "T" shaped drip arm having an extended leg having a cantilevered end suspended over the brush head and a cross arm spanning between and affixed to the bifurcated arms of said yoke; and a hose is coupled between a source of fluids and the tip of the extended leg of the "T" shaped drip arm.

5. The apparatus of claim 1 wherein:

said elongated arm has a proximal end positioned between said bifurcated arms of said yoke; and said first elongated arm is provided with a weight slidably suspended on said bar.

* * * * *